United States Patent
Kulkarni et al.

(10) Patent No.: US 7,398,502 B1
(45) Date of Patent: Jul. 8, 2008

(54) MICRO-CODED PROCESSORS FOR CONCURRENT PROCESSING IN A PROGRAMMABLE LOGIC DEVICE

(75) Inventors: Chidamber R. Kulkarni, Santa Clara, CA (US); Gordon J. Brebner, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 297 days.

(21) Appl. No.: 11/299,976

(22) Filed: Dec. 12, 2005

(51) Int. Cl.
*G06F 17/50* (2006.01)
(52) U.S. Cl. .......................................... 716/16; 716/17
(58) Field of Classification Search ..................... 716/1, 716/12–17
See application file for complete search history.

(56) References Cited

U.S. PATENT DOCUMENTS 6,363,519 B1 * 3/2002 Levi et al. ..................... 716/16
7,133,978 B1 * 11/2006 James-Roxby et al. ....... 711/152
7,185,309 B1 * 2/2007 Kulkarni et al. ............... 716/18
7,228,520 B1 * 6/2007 Keller et al. ................... 716/17

* cited by examiner

*Primary Examiner*—Jack Chiang
*Assistant Examiner*—Binh C Tat
(74) *Attorney, Agent, or Firm*—W. Eric Webostad (57) ABSTRACT

A method and system for concurrent data processing, and an integrated circuit having programmable logic therefor, are described. A multi-threaded application is parsed into respective threads. Data value variables, data operators, data processing order of execution, and data result variables are identified from the threads. A code listing is generated associated with each of the threads for the data value variables, the data operators, the data processing order of execution, and the data result variables identified. Source and destination address information is associated with the data value variables and the data result variables. The source and destination address information is ordered to preserve the data processing order of execution. A configuration bitstream is generated for instantiating thread-specific processors in programmable logic, the thread-specific processors associated with the threads each having at least a portion of the data operators.

20 Claims, 11 Drawing Sheets

MICRO-CODED PROCESSORS FOR CONCURRENT PROCESSING IN A PROGRAMMABLE LOGIC DEVICE

FIELD OF THE INVENTION

One or more aspects of the invention relate generally to integrated circuits and, more particularly, to micro-coded processors for concurrent processing.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

A design is conventionally instantiated in programmably configurable circuitry of an FPGA ("FPGA fabric") using a hardware description language ("HDL"). However, implementing a design for concurrent processing using an HDL is a tedious task owing to maintaining a correct order of execution of data processing as data propagates through programmed programmable logic. Accordingly, a more convenient way to implement a user application in an FPGA for concurrent processing is needed.

Others have suggested using multiple microprocessors for concurrent processing. However, microprocessors conventionally are limited to a fixed set of instructions, and thus instructions outside of the fixed set may be slow to execute. Additionally, such microprocessors conventionally have to decode instructions as part of data processing, which slows processing.

Still others have suggested using multi-Application Specific Instruction Processor (ASIP) architectures, such as may be used in network processors. In for an ASIP architecture, a user's code is parsed to identify instructions not part of a set of conventional instructions. The instructions identified are then used to augment the decode logic of a conventional microprocessor to provide the set of conventional instructions with additional customized instructions. Conventionally, network processors use multi-threaded processing units with a customized instruction set and customized memory architectures. However, ASIP architectures are still limited with respect to concurrent processing by limitations of decoding instructions, as well as limited by the number of microprocessors.

To address a more robust programming environment, others have suggested programming in Handel-C to port C programs to FPGA fabric. However, Handel-C is conventionally a language that requires cycle accurate information, where each statement is associated with a single clock cycle. However, programmers may want to write a program listing to merely execute in a sequence without being limited to knowledge of clock cycle accurate information.

Accordingly, it would be desirable and useful to provide means for providing concurrent processing in an FPGA that avoids one or more of the above-mentioned limitations.

SUMMARY OF THE INVENTION

One or more aspects of the invention generally relate to integrated circuits and, more particularly, to micro-coded processors instantiated in programmable logic for concurrent processing.

An aspect of the invention is a method for concurrent data processing. A multi-threaded application is parsed into respective threads. Data value variables, data operators, data processing order of execution, and data result variables are identified from the threads. A code listing is generated associated with each of the threads for the data value variables, the data operators, the data processing order of execution, and the data result variables identified. Source and destination address information is associated with the data value variables and the data result variables. The source and destination address information is ordered to preserve the data processing order of execution. A configuration bitstream is generated for instantiating thread-specific processors in programmable logic. The thread-specific processors associated with the threads each have at least a portion of the data operators.

Another aspect of the invention is an integrated circuit having programmable logic. Thread-specific processors are coupled to one another and instantiated in the programmable logic responsive to a multi-threaded application. Instruction memory for storing source and destination address information is coupled to the thread-specific processors. Data memory for storing data values and data results is coupled to the thread-specific processors. Each of the thread-specific processors includes a data movement engine and a compute engine. The source and destination address information is associated with a sequence of data operations to be performed by the thread-specific processors on the data values stored to produce the data results. The thread-specific processors in combination with the sequence of data operations as associated with the source and destination address information provide micro-coded processors for concurrent processing.

Yet another aspect of the invention is a system for concurrent data processing. Thread-specific processors are coupled to one another and instantiated in programmable logic responsive to a multi-threaded application. The multi-threaded application is parsed into respective threads, the threads having data value variables, data operators, data processing order of execution, and data result variables. The thread-specific processors are instantiated from a configuration bitstream. The configuration bitstream is provided by: conversion of the threads into a code listing; associating source address information with the data value variables in the code listing; associating destination address information with the data result variables in the code listing; associating the source address information and the destination address information to provide source and destination address information; and ordering the source and destination address information to preserve the data processing order of execution. Instruction memory for storing the source and destination address information may be coupled to the thread-specific processors. Data memory for storing data values associated with the data value variables and for storing data results associated with the data result variables may be coupled to the thread-specific processors. Each of the thread-specific processors includes a data movement engine and a compute engine. The thread-specific processors in combination with the source and destination address information as ordered provide micro-coded processors for concurrent processing without having to decode instructions.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
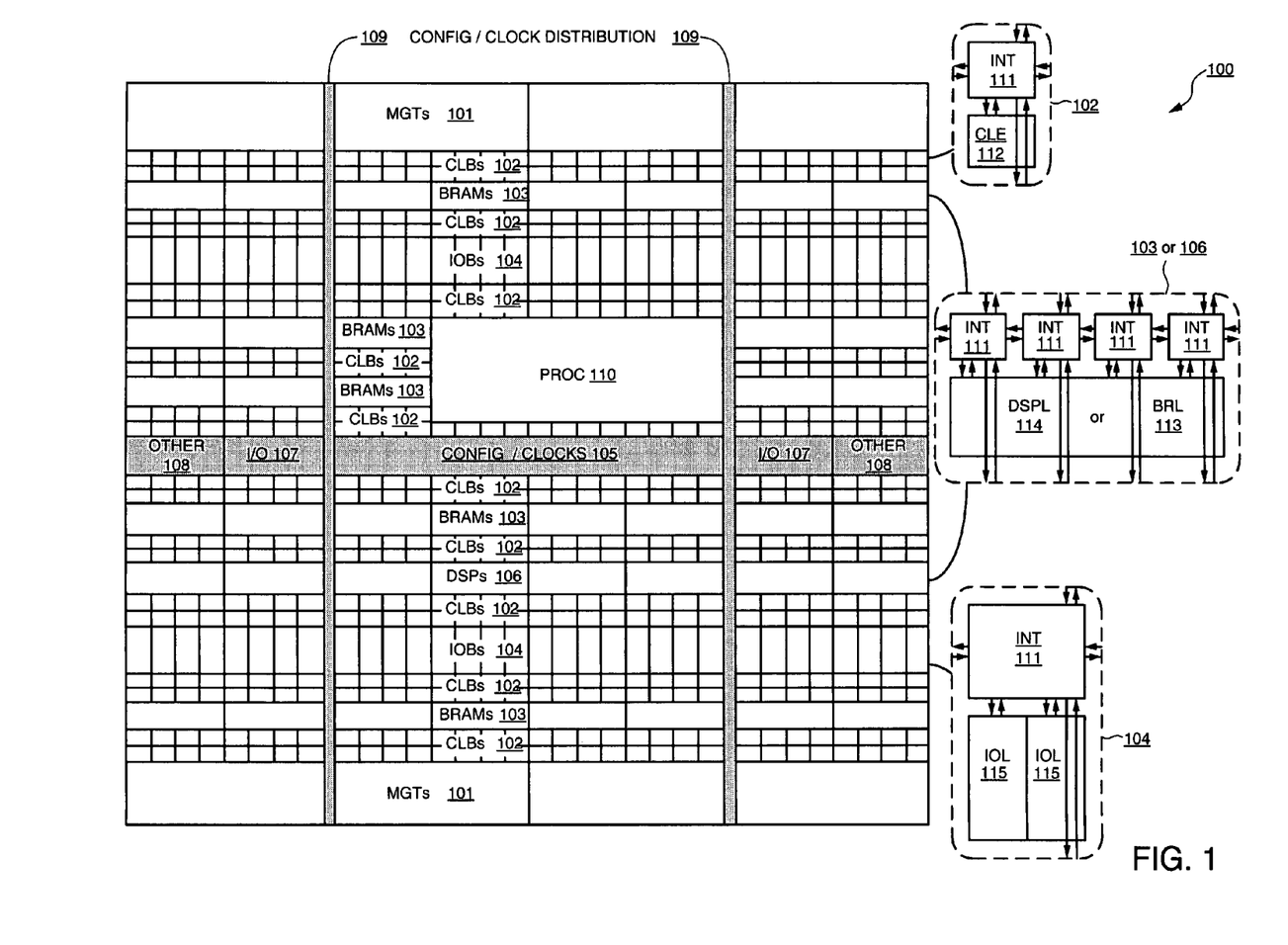
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
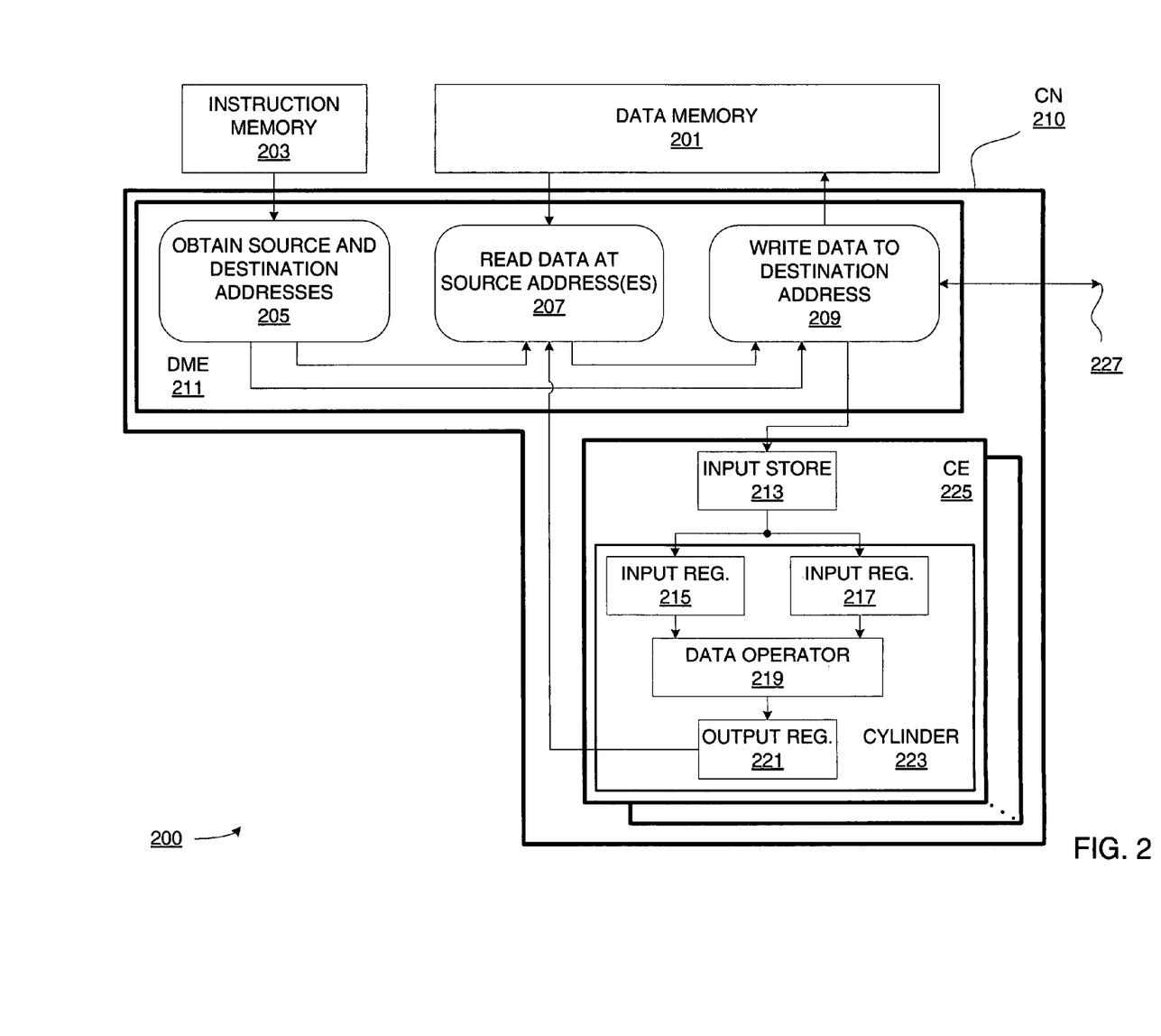
FIGS. 2, 3A, 3B, and 3C are high-level block diagrams depicting alternative exemplary embodiments of micro-coded concurrent processing systems.

FIG. 2 is a high-level block diagram depicting an exemplary embodiment of a micro-coded concurrent processing system 200. Micro-coded concurrent processing system 200 includes instruction memory 203, data memory 201, and computational node ("CN") 210. Instruction memory 203 and data memory 201 are coupled to CN 210, and CN 210 may be implemented in programmable logic of an integrated circuit. The integrated circuit may be a programmable logic device ("PLD"), such as FPGA 100 of FIG. 1 for example, or other type of integrated circuit having programmable logic. CN 210 includes data movement engine ("DME") 211 and one or more compute engines ("CE") 225.

States 205, 207, and 209 of DME 211 are illustratively shown. It should be appreciated that DME 211 may be implemented as one or more state machines which manage movement of data for a CN 210. Input store 213 of CE 225 may be implemented as a register or other known form of temporary storage device.

One or more state machines of DME 211 are responsible for managing information and data movement, which may vary responsive to context as may be determined by a compiler. Examples of different information and data movements are from an outside memory, such as data memory 201, to one or more input stores, such as input store 213; from an input store, such as input store 213, to registers of a cylinder, such as one or more of input registers 215 and 217 of cylinder 223 of CE 225; from an output register, such as output register 221 of cylinder 223, to an input store or register of a cylinder, such as input store 213 or input registers 215 or 217 of cylinder 223; and between nearest neighbor CNs, such as between another CN and CN 210. Accordingly, DME 211 may be implemented either as a multi-threaded engine sharing one or more state machines to perform different data movements or as a super-scalar engine, wherein multiple state machines concurrently issue data movement instructions. As will become more apparent from the following description, no actual instructions are obtained from instruction memory 203 by DME 211; rather, only addresses may be obtained from instruction memory 203.

At obtain source and destination addresses state 205, DME 211 obtains source and destination addresses from instruction memory 203. At read data at source address state 207, each source address obtained at state 205 is provided for reading data from data memory 201 or output register 221 depending on the source address. At write data to destination address state 209, each destination address obtained at state 205 is provided for writing data associated with such destination address to data memory 201 or input store 213 or to a neighboring CN via route 227 depending upon the destination address. The data written to a destination address for state 209 is stored in, for example, input store 213 and processed by a CE, such as CE 225. The processed data output from output register 221 may be read for state 207 and then provided to state 209 for writing such processed data to data memory 201 or for writing to input store 213 or for writing to a neighboring CN via route 227.

It should be appreciated that DME 211 may be implemented as one or more state machines used to provide a fetch-execute cycle. Thus, once an instruction word in the form of addresses is read from instruction memory 203, where such instruction word may merely be one or more source addresses and a destination address for data memory 201, decoding of an instruction is avoided. In read state 207, a source address obtained is used to read data from data memory 201. In write state 209, processed data may be written back to a destination address in data memory 201.

It should be appreciated that DME 211 may be implemented as one or more state machines as DME 211 may only move data from a shared memory, namely data memory 201, to a CE 225, and move processed data output from such CE 225 back to data memory 201. This is done responsive to addresses obtained by DME 211 from instruction memory 203.

Thus, an implicit move instruction for moving data may be implemented in instruction memory 203 as respective source and destination addresses are sequentially stored for execution. As shall become more clear from the following description, a NO operation ("NOP") may be inserted for source and destination addresses by using a null address space. In the description that follows, it should be appreciated that data dependencies may be micro-coded by sequencing of addresses in instruction memory 203 for data processing, which may or may not include use of a null address space. Thus, it should be appreciated that addresses in instruction memory 203 may be sequenced to obtain correct order of execution by computational nodes, such as CN 210, as handled by multiple fetch-execution state machines, such as DME 211. Operations may be executed each cycle with an initial latency of two cycles. The two cycles are associated with the two states for each fetch-execute operation, namely one cycle to obtain address information and read data as associated with states 205 and 207 and another cycle to write data as associated with state 209. Notably, data memory 201 may be shared among multiple DMEs or may be dedicated to respective DMEs, depending on performance and resource utilization limits. It should be appreciated that a destination address read from instruction memory 203 may be to a nearest neighbor memory, where such nearest neighbor memory is associated with a neighboring CN of CN 210.

Each CE 225 may include one or more data operators 219 depending on the type of instruction to be instantiated in programmable logic. However, for purposes of clarity by way of example, only a single data operator 219 is shown for each CE 225. Furthermore, as will be appreciated, for some operations, only one input register, such as input register 215, may be used. An example of such an operation would be an invert operation where bits are merely inverted from an input. Moreover, for other instructions more than two data samples, and thus more than two source addresses and more than two input registers, may be implemented. However, for purposes of clarity by way of example and not limitation, it shall be assumed that two data samples are obtained for processing by a single data operator.

Figure 3A:
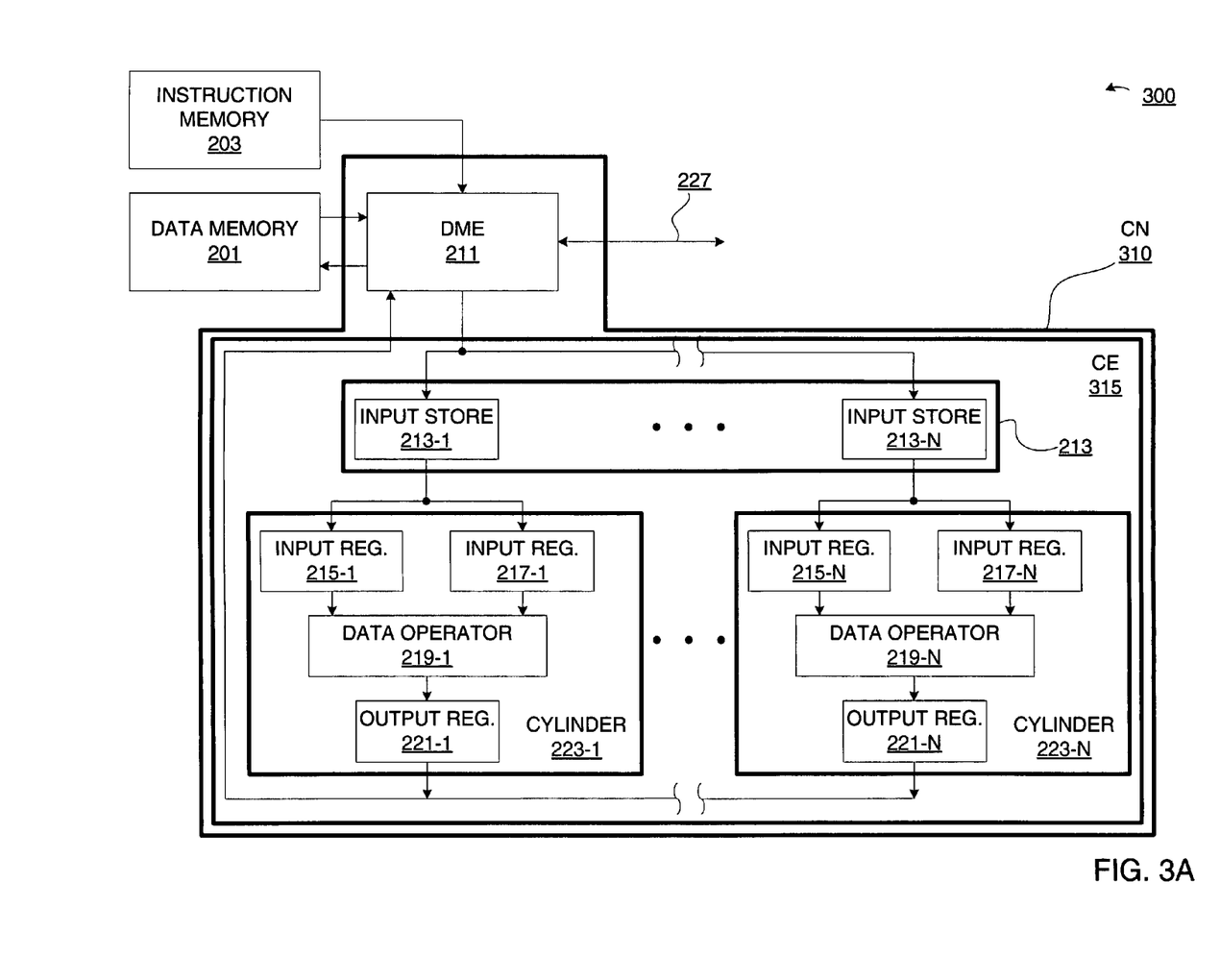

FIG. 3A is a high-level block diagram depicting an exemplary embodiment of a micro-coded concurrent processing system 300. System 300 of FIG. 3A is similar to system 200 of FIG. 2, except that multiple cylinders, namely cylinders 223-1 through 223-N for N a positive integer greater than one, are more particularly shown for CE 315 of CN 310. DME 211 may be configured to obtain data from data memory 201 and provide such data to respective input stores 213-1 through 213-N of input store 213. Input stores 213-1 through 213-N may be respectively associated with cylinders 223-1 through 223-N. Output from input stores 213-1 through 213-N may be respectively input to cylinders 223-1 through 223-N. For the example of input store 213-1, it should be appreciated that for an operation involving two data samples, such data samples may be read responsive to one or two source addresses obtained by DME 211 from instruction memory 203. Alternatively, a protocol, such as a single source address and one or more address offsets therefrom, may be used.

Input store 213-1 may provide these separate data samples respectively to input registers 215-1 and 217-1. Output from input registers 215-1 and 217-1 may be provided to a data operator 219-1. Output of data operator 219-1 operating on such data samples may be provided to output register 221-1, and output from output register 221-1 may be provided back to DME 211 for writing to data memory 201 responsive to a destination address obtained from instruction memory 203, where the destination address is associated with cylinder 223-1. The same process, which may include one or more NOPs as null address spaces, may be done for any cylinder 223-N, where input store 213-N is provided data for writing to input registers 215-N and 217-N, respectively, for operation by data operator 219-N. Output of data operator 219-N may be provided to output register 221-N for output to DME 211, and DME 211 may be used to control the writing of such output from output register 221-N to data memory 201 at a destination address obtained from instruction memory 203 in association with cylinder 223-N.

Figure 3B:
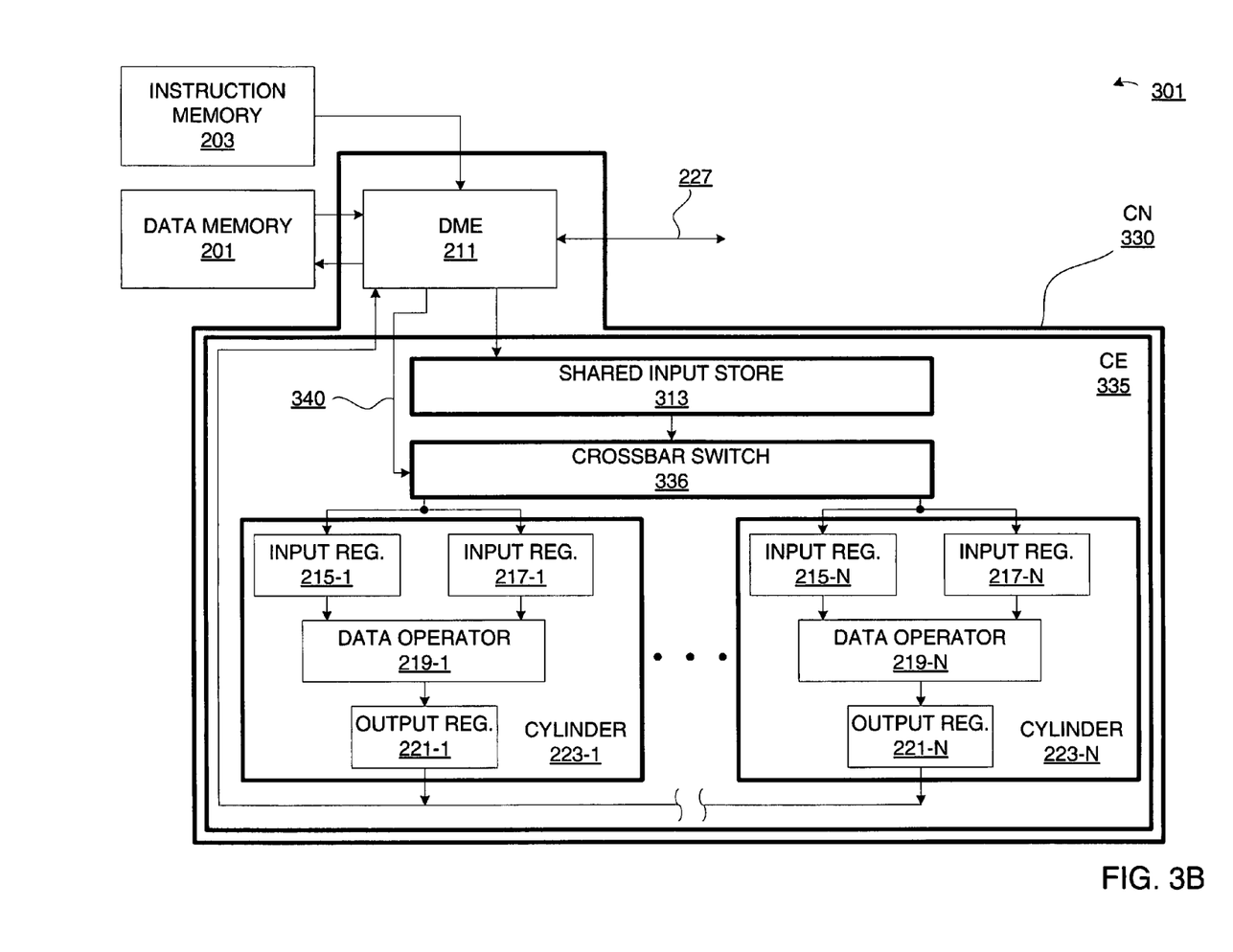

FIG. 3B is high-level block diagram depicting an exemplary embodiment of a micro-coded concurrent processing system 301. System 301 of FIG. 3B is similar to system 300 of FIG. 3A, except that input store 213 of CE 315 of FIG. 3A is replaced with a shared input store 313 and a crossbar switch 336 of CE 335 of FIG. 3B for a CN 330. In applications where input data may be shared among cylinders, such as cylinders 223-1 through 223-N, such data may be provided to a shared input store 313 under control of DME 211 from data memory 201 responsive to source addresses obtained from instruction memory 203. The sequence of such source addresses may be provided as a control signal 340 from DME 211 to crossbar switch 336 for control thereof. Accordingly, crossbar switch 336 may be coupled to an output of shared input store 313 to cross-connect data responsive to the sequence of source addresses to cylinders 223-1 through 223-N. Again, it should be appreciated that any of cylinders 223-1 through 223-N may have a null address space indicating a NOP condition.

Figure 3C:
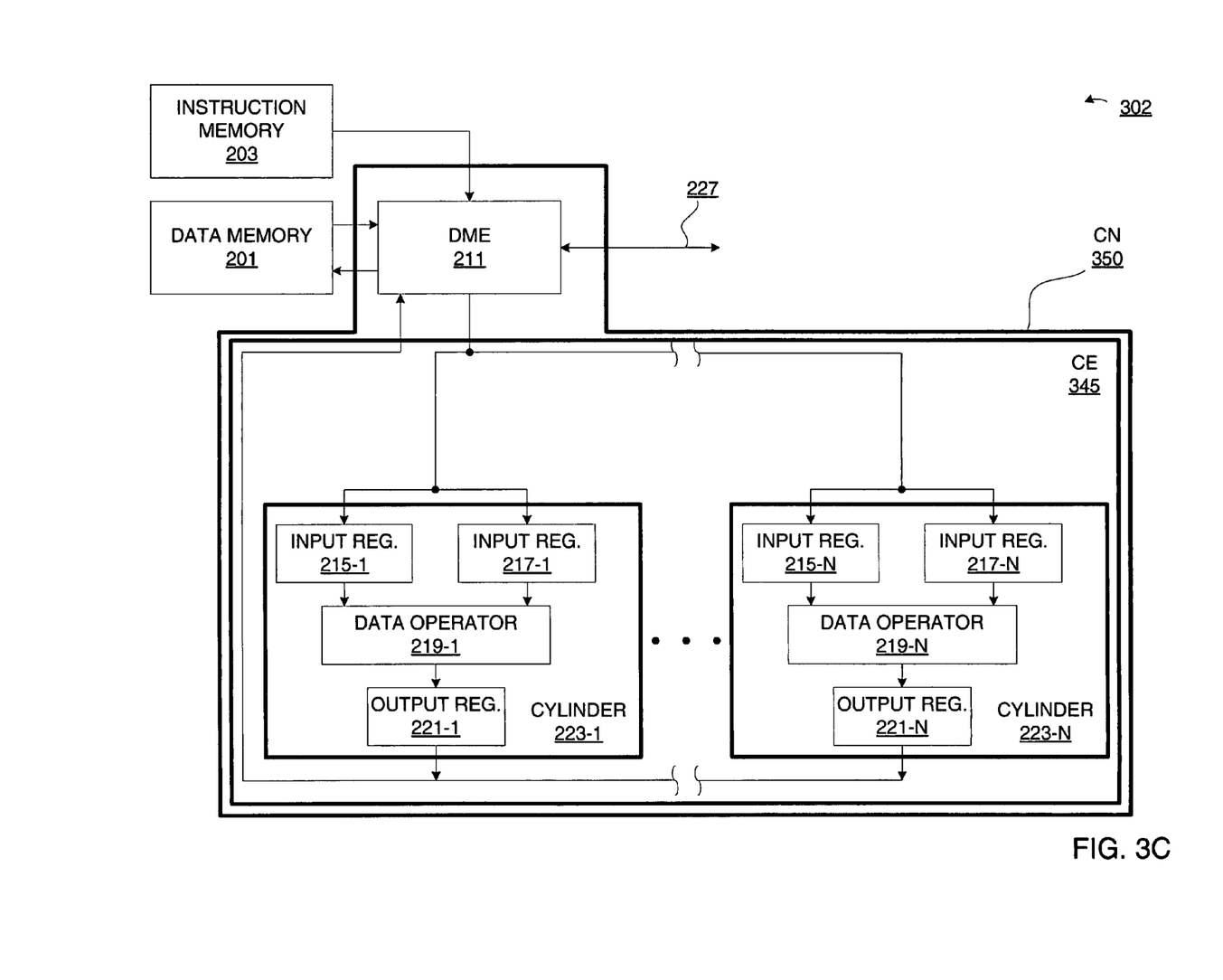

FIG. 3C is a high-level block diagram depicting an exemplary embodiment of a micro-coded concurrent processing system 302. System 302 of FIG. 3C is similar to system 300 of FIG. 3A, except that input store 213 is omitted in favor of a more direct coupling of DME 211 to cylinders 223-1 through 223-N to provide CE 345 of CN 350. In implementations where there are sufficient resources to have added cylinders, it may be that latency associated with a read of data memory 201 and a subsequent write to data memory 201, namely a two-cycle latency, may be masked by having additional cylinders to allow for more concurrent operations of a CE 345. Thus, for example, input store 213 of CE 315 of FIG. 3A may be avoided by routing data to an added cylinder used to increase the level of concurrency of CE 345 over that of CE 315 of FIG. 3A. Furthermore, it should be appreciated that shared input store 313 of CE 335 of FIG. 3B may be omitted, in which embodiment DME 211 would be used to provide data from data memory 201 more directly to crossbar switch 336, provided there are sufficient number of cylinders 223 such that buffering using an input store to address two-cycle latency may be avoided.

Figure 4:
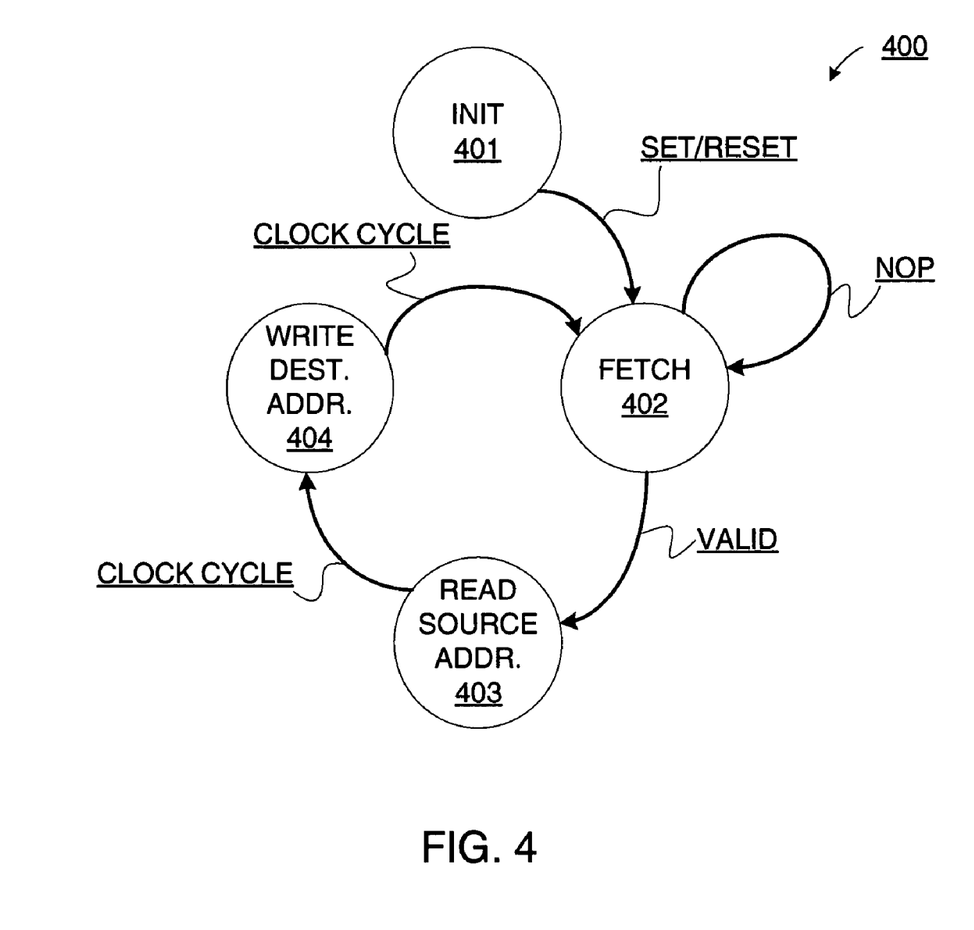
FIG. 4 is a state diagram depicting an exemplary embodiment of a state machine.

FIG. 4 is a state diagram depicting an exemplary embodiment of a state machine 400. State machine 400 may be used to implement a DME, such as DME 211 of FIGS. 3A, 3B, and 3C. From an initialization state 401, state machine 400 transitions, such as responsive to a set or reset signal, to fetch state 402. Notably, states 402, 403, and 404 of FIG. 4 are analogous to states 205, 207, and 209 of FIG. 2. In fetch state 402, state machine 400 obtains from an instruction memory, such as instruction memory 203 of FIGS. 2, 3A, 3B, and 3C, source and destination addresses from an initial row. If such addresses are for a null space, indicating a NOP condition, state machine 400 stays in fetch state 402 and obtains source and destination addresses in a next row in instruction memory 203. If, however, addresses fetched at 402 are valid and are not for a NOP condition, state machine 400 transitions from fetch state 402 to read source address state 403. At read source address state 403, state machine 400 reads data from data memory 201 at one or more source addresses fetched in fetch state 402. This read is done during a read clock cycle. At or about the completion of such a read clock cycle, state machine 400 transitions from read source address state 403 to write destination address state 404. At write destination address state 404, state machine 400 writes data obtained from a CN associated with state machine 400 or a nearest neighbor CN to data memory 201 at a destination address fetched at fetch state 402. At or about the completion of a write clock cycle, state machine 400 transitions from write destination address state 404 to fetch state 402, and fetching resumes at a next row in instruction memory 203. It should be appreciated that read and write clock cycles may be responsive to the same clock signal frequency.

Figure 5A:
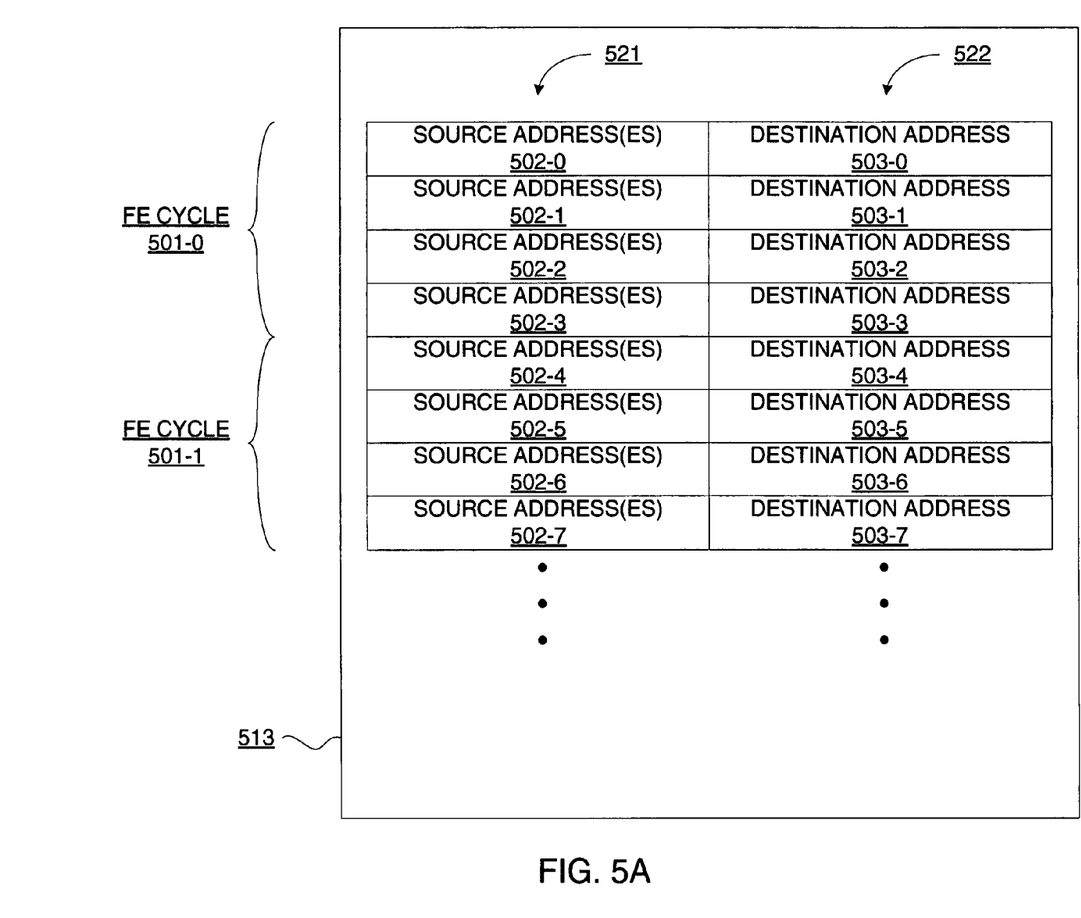
FIG. 5A is a high-level block diagram depicting an exemplary embodiment of an instruction memory.

FIG. 5A is a high-level block diagram depicting an exemplary embodiment of an instruction memory 513. Instruction memory 513 may be instruction memory 203 of FIGS. 2, 3A, 3B, and 3C. In column 521 of instruction memory 513 are source addresses 502. In column 522 of instruction memory 513 are destination addresses 503 respectively associated with source addresses 502 of column 521. Thus, for example, source addresses 502-0 through 502-7 are respectively associated with destination addresses 503-0 through 503-7. It should be appreciated, depending on how data is stored, that one or more than one source address may be used to obtain data samples. Furthermore, it should be appreciated that in some implementations it may be desirable to have more than two data samples operated on at a time. However, again for purposes of clarity, it shall be assumed that each operation involves two data samples which are stored at respective source addresses. For each fetch-execution ("FE") cycle 501, source addresses from column 521 and destination addresses from column 522 are obtained. For example, fetch-execution cycle 501-0 involves the first four rows of source and destination addresses of instruction memory 513, namely source addresses 502-0 through 502-3 and their respective destination addresses 503-0 through 503-3. Thus, on an initial fetch-execution cycle, data associated with these source addresses is obtained, operated on, and written back to respective destination addresses. On a subsequent fetch-execution cycle, namely fetch-execution cycle 501-1, a next four rows of instruction memory 513 are accessed to obtain source and destination addresses, namely source addresses 502-4 through 502-7 and their respective destination addresses 503-4 through 503-7. Although only two fetch-execution cycles are illustratively shown, it should be appreciated that more than two or fewer than two fetch-execution cycles may be implemented. Furthermore, it should be appreciated that although four row address fetches are shown for each fetch-execution cycle 501-0 and 501-1, fewer or more than four rows may be accessed for a fetch-execution cycle. However, each fetch-execution cycle for a thread may have the same number of rows accessed in order to maintain a correct sequence of execution for data processing.

Figure 5B:
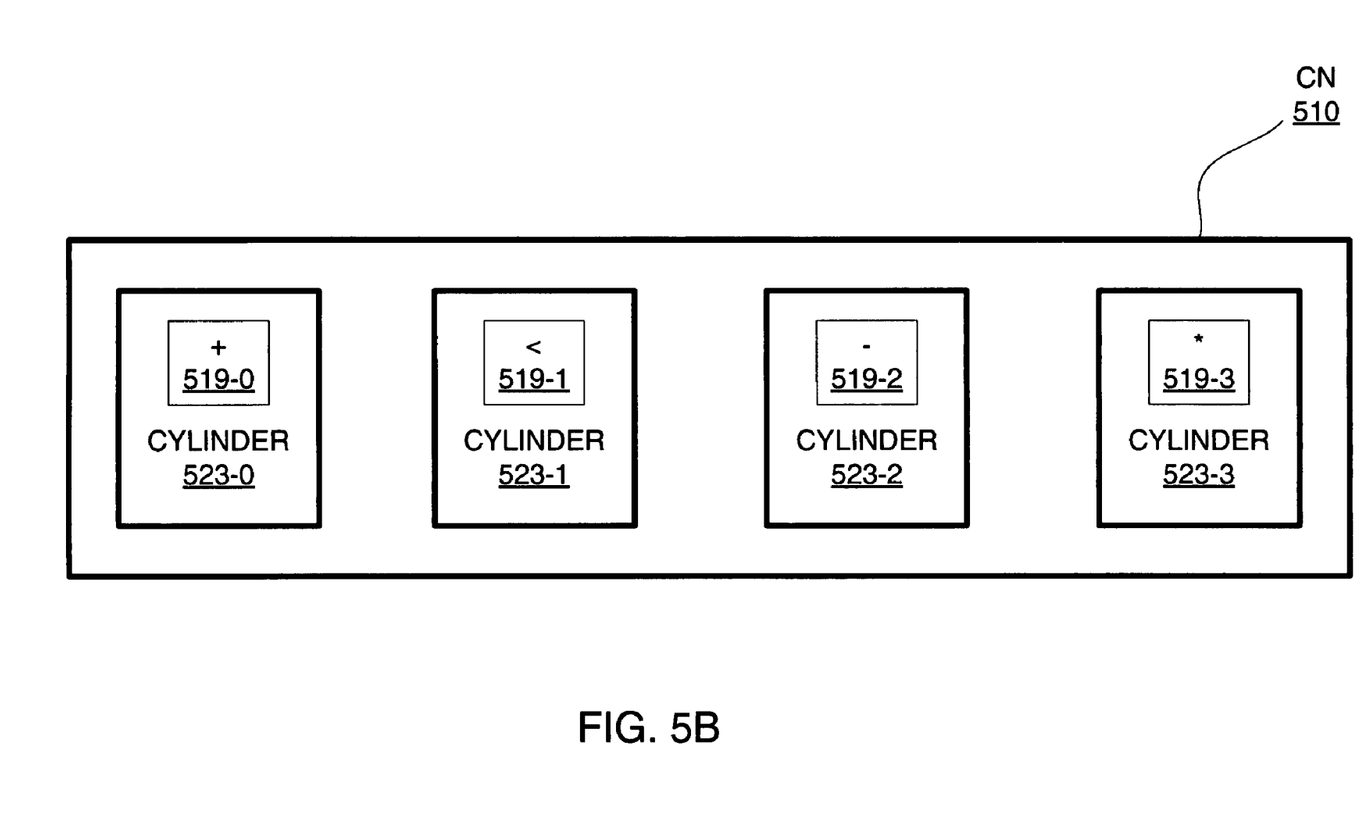
FIG. 5B is a high-level block diagram depicting an exemplary embodiment of a computational node ("CN").

FIG. 5B is a high-level block diagram depicting an exemplary embodiment of a CN 510. CN 510 may be for a thread of a multi-threaded user application, and CN 510 may be an implementation of CN 210 of FIG. 2. In this particular example, cylinders 523-0 through 523-3 are illustratively shown; however, fewer or more than four cylinders may be implemented for a thread. With combined reference to FIGS. 5A and 5B, cylinder 523-0 corresponds to one or more source addresses 502-0 and a destination address 503-0 of fetch-execution cycle 501-0, to one or more source addresses 502-4 and a destination address 503-4 of fetch-execution cycle 501-1, and to subsequent initial rows of each subsequent fetch-execution cycle. Cylinder 523-1 corresponds to one or more source addresses 502-1 and a destination address 503-1 of fetch-execution cycle 501-0, to one or more source addresses 502-5 and a destination address 503-5, and to each subsequent second row of each fetch-execution cycle. Continuing the example, cylinder 523-2 and cylinder 523-3 respectively correspond to addresses 502-2 and 503-2 and addresses 502-3 and 503-3 for fetch-execution cycle 501-1, and the third and fourth row of addresses respectively for each subsequent fetch-execution cycle. Thus, it should be appreciated that for each row in instruction memory 513 there is a corresponding cylinder within a fetch-execution cycle, and this correspondence consistently repeats for each subsequent fetch-execution cycle. Thus, for example, for cylinder 523-0 having an addition data operator 519-0, each time data is obtained from source addresses in an associated initial row in instruction memory 513 for a fetch-execution cycle, such data samples will be added and then written back to an associated destination address space. Furthermore, in this example, cylinders 523-1, 523-2, and 523-3 each are illustratively shown having different operators 519-1, 519-2, and 519-3 respectively. Operator 519-1 is a less than operator, namely a shift operator; operator 519-2 is a subtractor; and operator 519-3 is a multiplier. Notably, these are but a subset of the known operators that may be used in implementing data operations. Other examples of known operators that may be used include a greater than operator and bit-wise ANDing operator, among other known types of data operators that may be associated with microprocessor instructions.

Thus, it should be appreciated that depending on what operators are needed for each fetch-execution cycle, a data execution sequence using a collection of such operators as associated with threads of a multi-threaded user application may be instantiated in programmable logic of a PLD, such as FPGA 100 of FIG. 1. A set of operators may be formed for each thread, and thus each CN, such as CN 510 for example, respectively associated with each thread is a thread-specific processor.

Figure 6:
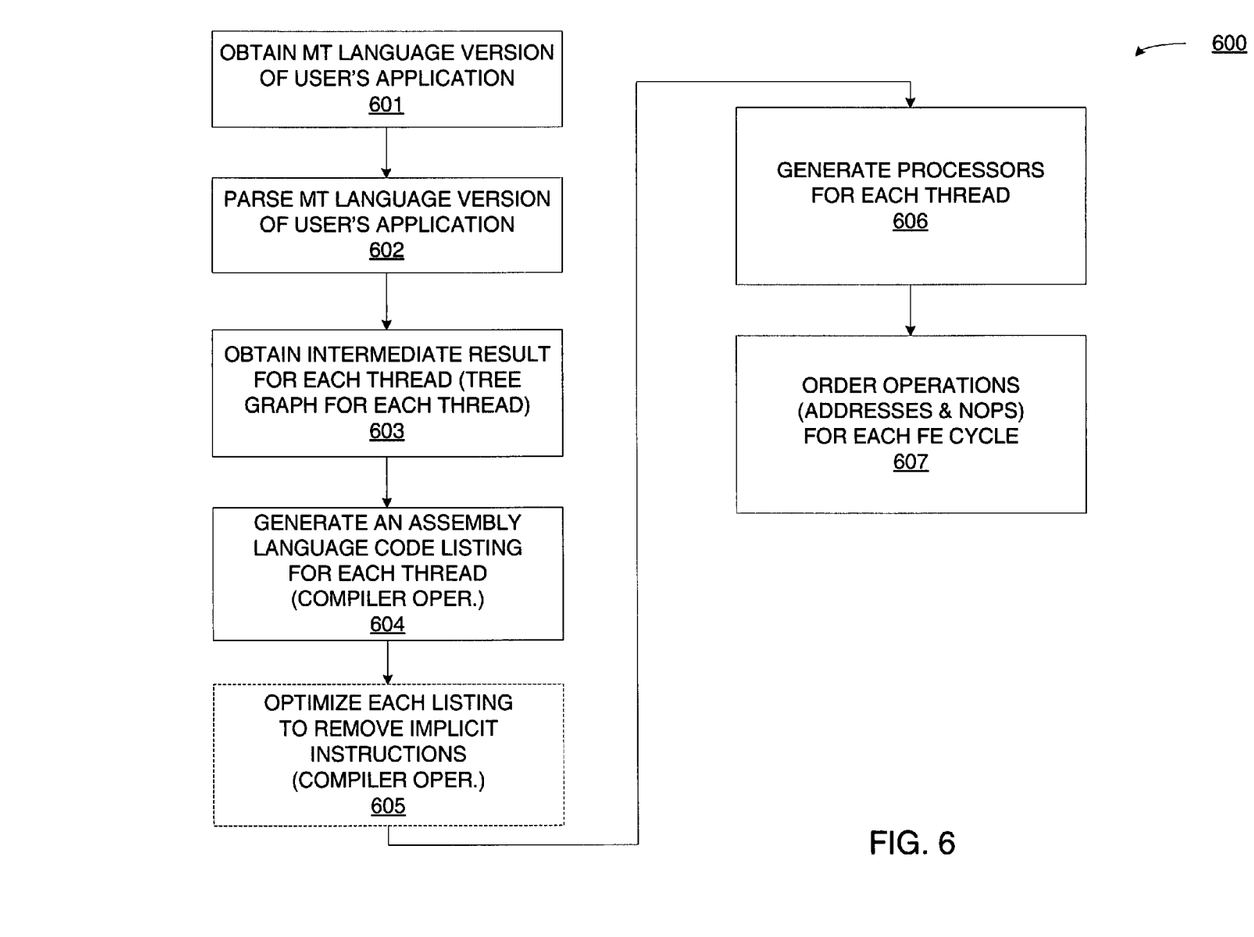
FIG. 6 is a flow diagram depicting an exemplary embodiment of a processor and source and data address generation flow.

FIG. 6 is a flow diagram depicting an exemplary embodiment of a processor and source and data address generation flow 600. At 601, a multi-threaded ("MT") language version of a user's application is obtained. At 602, the multi-threaded language version of the user's application is parsed into respective threads. At 603, an intermediate result is obtained for each thread. This intermediate result may be represented as a tree graph or other object-oriented depiction.

At 604, an assembly language code listing is generated for each thread. This may be done by compiling the intermediate result obtained at 603. Optionally, at 605, each listing generated at 604 may be recompiled to remove implicit instructions. Thus, for example, implicit instructions may be removed to reduce the amount of resources used, as well as to improve performance. At 606, each assembly language code listing for each thread is used to generate respective processors for each thread. Each such processor may be generated by converting the assembly language code into a configuration bitstream for programming an FPGA. Thus, each thread of a user application may be implemented as a respective processor in an FPGA.

At 607, operations for each fetch-execution cycle, including any NOP conditions, are ordered. The order of operations is associated with source and destination addresses for each fetch-execution cycle. Notably, source address information and destination address information may be separately assigned to variables, and then such source address information and destination address information may be combined into an instruction word. Again, though the term "instruction" is used herein for purposes of clarity, no instructions are decoded in operation of thread-specific processors as described herein.

Figure 7:
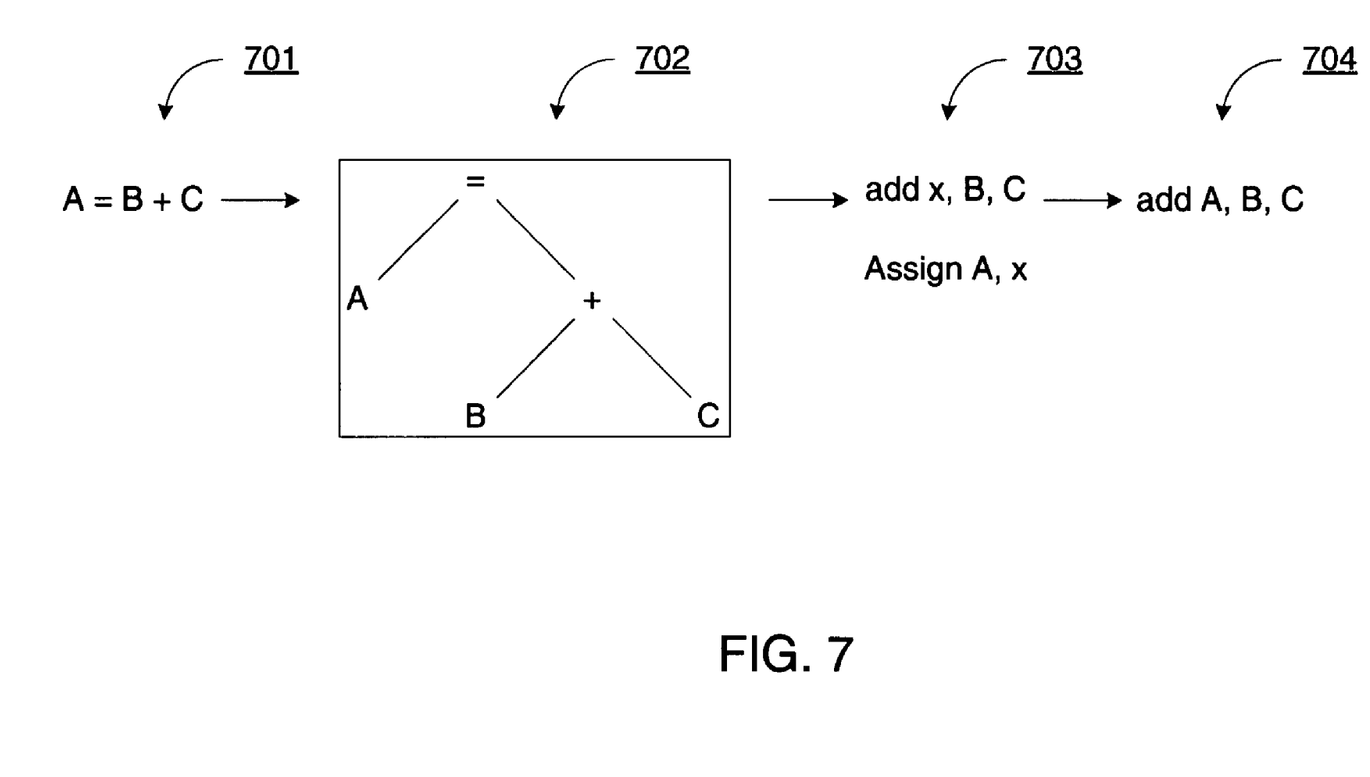
FIG. 7 is a symbolic diagram depicting an example of converting a thread to an assembly language instruction.

FIG. 7 is a symbolic diagram depicting an example of converting a thread 701 to an assembly language instruction 704. Thread 701, which is a simple "A=B+C" argument, is converted to a graphic representation, namely a tree diagram 702. Tree diagram 702 is converted into an assembly language listing 703. Assembly language listing 703 may be optimized, as it should be apparent that a compiler's insertion of the x variable may be resolved into assembly language listing 704. Accordingly, source addresses for B and C data values would be included in an instruction memory listing for execution of thread 701. Additionally, a destination address for result A would be associated with the source addresses for B and C data values.

Figure 8:
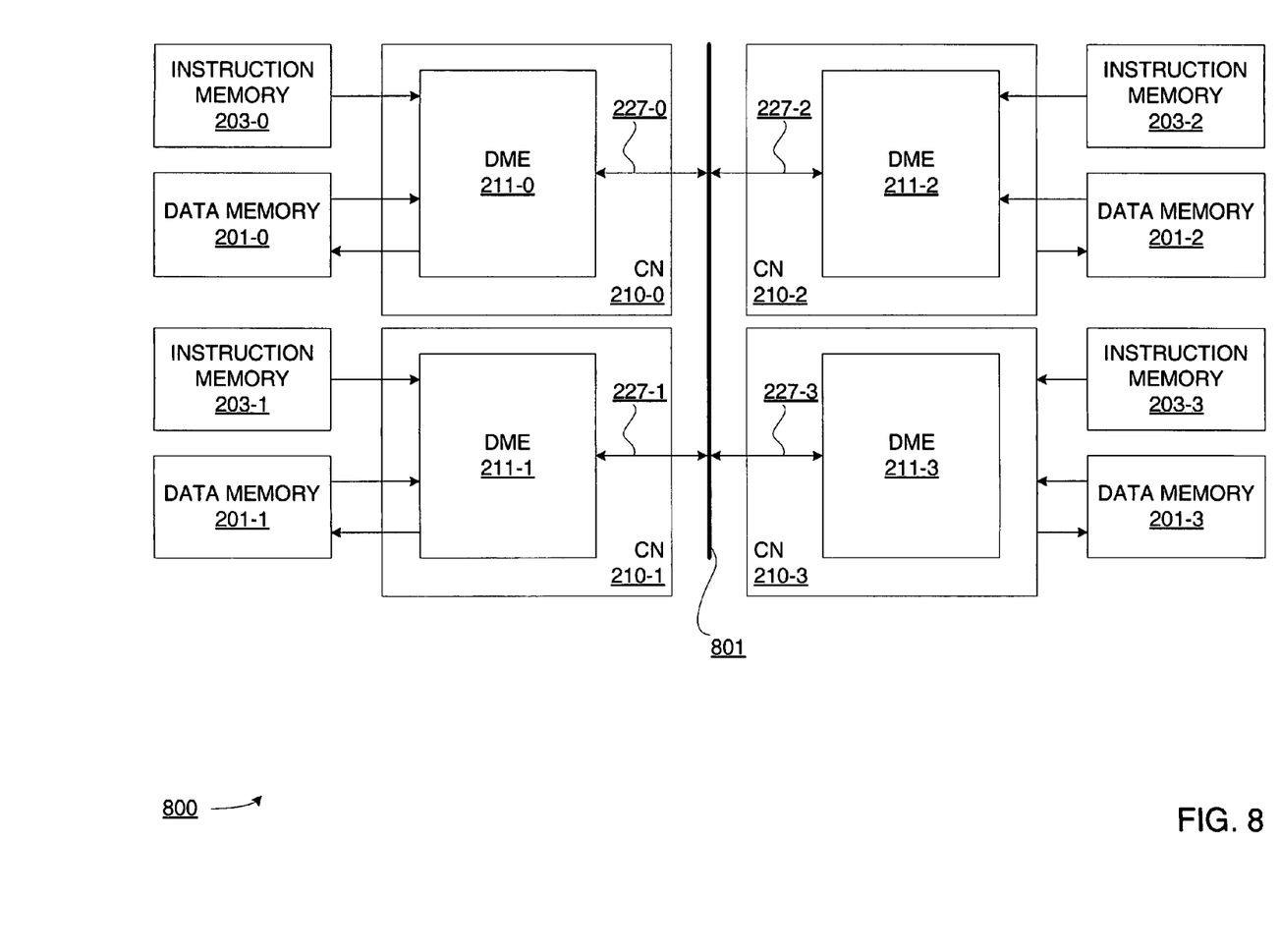
FIG. 8 is a block diagram depicting an exemplary embodiment of a four-node system.

FIG. 8 is a block diagram depicting an exemplary embodiment of a four-node system 800. System 800 includes CNs 210-0 through 210-3, where each CN 210-0 through 210-3 may communicate with one another via a bus 801. Accordingly, bidirectional ports 227-0 through 227-3 corresponding to DMEs 211-0 through 211-3 of respective CNs 210-0 through 210-3 may be used for communicating to and from bus 801. Although data memory and instruction memory may be shared by CNs 210-0 through 210-3, it should be appreciated that instructions and data are particular for a thread implemented as a computational node or processor. Accordingly, separate blocks are illustratively shown in FIG. 8; for example, instruction memory 203-0 and data memory 201-0 are illustratively shown as associated with computation node 210-0. Moreover, each computation node 210-1 through 210-3 has respective instruction memory 203-1 through 203-3 and data memory 201-1 through 201-3 associated therewith.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for concurrent data processing, comprising:
parsing a multi-threaded application into respective threads;
identifying data value variables, data operators, data processing order of execution, and data result variables from the threads;
generating a code listing associated with each of the threads for the data value variables, the data operators, the data processing order of execution, and the data result variables identified;
associating source and destination address information with the data value variables and the data result variables;
ordering the source and destination address information to preserve the data processing order of execution;
generating a configuration bitstream for instantiating thread-specific processors in programmable logic, the thread-specific processors associated with the threads each having at least a portion of the data operators;
wherein the data processing order of execution is associated with the source and destination address information for fetch-execution cycles of the thread-specific processors being executable without explicit instructions; and
wherein implicit move instructions are within the source and destination address information being ordered to preserve the data processing order of execution for execution without move instruction decoding.

2. The method according to claim 1, wherein the ordering includes grouping the source and destination address information into the fetch-execution cycles for operation of the thread-specific processors.

3. The method according to claim 2, wherein a portion of the fetch-execution cycles are for operation of one of the thread-specific processors.

4. The method according to claim 3, wherein the portion of the fetch-execution cycles has an associated portion of the source and destination address information, the associated portion of the source and destination address information divided up into respective source and destination address information groups for each fetch-execution cycle of the portion of fetch-execution cycles.

5. The method according to claim 4, wherein each of the thread-specific processors includes a compute engine and a data movement engine, the compute engine including cylinders, each of the cylinders including one or more data operators of the portion of the data operators coupled between input registers and an output register.

6. The method according to claim 5, wherein the source and destination address information groups are subdivided for respective association with each cylinder of the cylinders of the compute engine.

7. The method according to claim 6, wherein the source and destination address information groups are subdivided by row in instruction memory.

8. The method according to claim 1, further comprising:
obtaining the source and destination address information from instruction memory;
reading stored data from data memory responsive to a source portion of the source and destination address information in association with the data value variables;
providing the stored data read to the thread-specific processors;
moving the stored data read responsive to the implicit move instructions to the data operators for operating on the stored data read with the data operators to provide resultant data associated with the data result variables; and
writing the resultant data to the data memory responsive to a destination portion of the source and destination address information.

9. The method according to claim 1, wherein the source and destination address information includes at least one null address indicating a no operation condition to preserve the data processing order of execution while accounting for a data dependency among the threads.

10. An integrated circuit having programmable logic, comprising:
thread-specific processors coupled to one another and instantiated in the programmable logic responsive to a multi-threaded application;
instruction memory for storing source and destination address information coupled to the thread-specific processors;
data memory for storing data values and data results coupled to the thread-specific processors;
each of the thread-specific processors including a data movement engine and a compute engine;
the source and destination address information being associated with a sequence of data operations to be performed by the thread-specific processors on the data values stored to produce the data results, the thread-specific processors in combination with the sequence of data operations as associated with the source and destination address information providing micro-coded processors for concurrent processing;
wherein the sequence of data operations associated with the source and destination address information for fetch-execution cycles of the thread-specific processors being executable without explicit instructions; and
wherein implicit move instructions are within the source and destination address information being ordered to preserve the sequence of data operations for execution without move instruction decoding.

11. The integrated circuit according to claim 10, wherein the data movement engine of each of the thread-specific processors includes at least one state machine.

12. The integrated circuit according to claim 11, wherein the at least one state machine includes:
a first state for obtaining the source and destination address information;
a second state for reading the data values from the data memory responsive to a source address portion of the source and destination address information; and
a third state for writing the data results to the data memory responsive to a destination address portion of the source and destination address information.

13. The integrated circuit according to claim 12, wherein the data movement engine is coupled between the instruction memory and the compute engine and is coupled between the data memory and the compute engine, the data movement engine configured to control data movement between the data memory and the compute engine.

14. The integrated circuit according to claim 13, wherein the thread-specific processors are coupled to one another via data movement engines respectively thereof for movement of a portion of the data results between the thread-specific processors.

15. The integrated circuit according to claim 14, wherein the compute engine of each of the thread-specific processors includes at least one cylinder, the at least one cylinder including data input registration circuitry, data operator circuitry, and data output registration circuitry.

16. The integrated circuit according to claim 15, wherein the compute engine of each of the thread-specific processors includes input storage circuitry coupled between the at least one cylinder and the data movement engine.

17. The integrated circuit according to claim 16, wherein the input storage circuitry is coupled to the at least one cylinder via a crossbar switch of the compute engine, the crossbar switch controlled by the data movement engine.

18. The integrated circuit according to claim 17, wherein the programmable logic is of a Field Programmable Gate Array.

19. A system for concurrent data processing, comprising:
thread-specific processors coupled to one another and instantiated in programmable logic responsive to a multi-threaded application, the multi-threaded application parsed into respective threads, the threads having data value variables, data operators, data processing order of execution, and data result variables;
the thread-specific processors instantiated from a configuration bitstream, the configuration bitstream provided by,
conversion of the threads into a code listing;
associating source address information with the data value variables in the code listing;
associating destination address information with the data result variables in the code listing;
associating the source address information and the destination address information to provide source and destination address information;

ordering the source and destination address information to preserve the data processing order of execution;

instruction memory for storing the source and destination address information, the instruction memory coupled to the thread-specific processors;

data memory for storing data values associated with the data value variables and for storing data results associated with the data result variables, the data memory coupled to the thread-specific processors;

each of the thread-specific processors including a data movement engine and a compute engine;

the thread-specific processors in combination with the source and destination address information as ordered providing micro-coded processors for concurrent processing without having to decode instructions;

wherein the data processing order of execution is associated with the source and destination address information for fetch-execution cycles of the thread-specific processors being executable without explicit instructions; and wherein implicit move instructions are within the source and destination address information being ordered to preserve the data processing order of execution for execution without move instruction decoding.

20. The system according to claim 19, wherein the programmable logic is of a Field Programmable Gate Array, wherein the source and destination address information as ordered is divided into fetch-execution cycles, and wherein, within each of the fetch-execution cycles, the source and destination address information therein is respectively associated with data operators of the compute engine.

* * * * *